(12) United States Patent
Zhou

(10) Patent No.: US 6,847,808 B2
(45) Date of Patent: Jan. 25, 2005

(54) ULTRA-HIGH LINEARITY RF PASSIVE MIXER

(75) Inventor: Sining Zhou, Los Angeles, CA (US)

(73) Assignee: G-Plus, Inc., Santa Monica, CA (US)

(*) Notice: Subject to any disclaimer, the term of this patent is extended or adjusted under 35 U.S.C. 154(b) by 351 days.

(21) Appl. No.: 10/086,937

(22) Filed: Feb. 28, 2002

(65) Prior Publication Data

US 2003/0162515 A1 Aug. 28, 2003

(51) Int. Cl.$^7$ ................................................ H04B 1/18
(52) U.S. Cl. ................ 455/189.1; 455/209; 455/278.1; 327/206; 327/210
(58) Field of Search ................................ 327/2, 3, 4, 7, 327/162, 163, 175, 203, 206, 207, 209, 210, 221, 231; 455/189.1, 191.3, 205, 209, 230, 251.1, 255, 273, 278.1, 295, 296

(56) References Cited

U.S. PATENT DOCUMENTS 6,317,590 B1 * 11/2001 Nash et al. ................. 455/331
6,369,641 B1 * 4/2002 McNamara et al. ........ 327/532
6,397,044 B1 * 5/2002 Nash et al. .................. 455/73

* cited by examiner

Primary Examiner—Tony T. Nguyen
(74) Attorney, Agent, or Firm—Foley & Lardner LLP

(57) ABSTRACT

A CMOS implemented passive mixer circuit for improving linearity performance in wireless communication systems is described, including dual pairs of NMOS FETs and dual pairs of PMOS FETs. Each NMOS FET is connected in parallel with a corresponding PMOS FET. A local oscillator signal is provided to the gate of one FET while a 180-degree phase shifted local oscillator signal is provided to the gate of its complementary FET. Because the complementary FETs are driven by local oscillator signals that are 180 degrees out of phase, the NMOS FET is turned on for at least a portion of the positive cycle of the local oscillator signal and the PMOS FET is turned on for at least a portion of the negative cycle of the 180-degree phase shifted local oscillator signal. Distortion in the mixed output signal is thereby reduced.

28 Claims, 9 Drawing Sheets

ULTRA-HIGH LINEARITY RF PASSIVE MIXER

BACKGROUND OF THE INVENTION

1. Field of the Invention

Embodiments of the present invention relate to mixer circuits for use in communication systems, and in preferred embodiments to a passive mixer circuit having ultra-high linearity for use in wireless communication systems and to wireless communication systems that employ such a passive mixer circuit.

2. Description of Related Art

Mixers are used in transceivers in many commercial wireless applications, including wireless Local Area Networks (LANs), wireless personal communication devices including radios, cellular telephones, mobile cordless telephones, Personal Digital Assistants (PDAs), Personal Computer Memory Card International Association (PCMCIA) computer interface applications, telemetry systems, global positioning systems (GPS) and other radio frequency (RF) devices.

In such applications, the transmitted and received signal is an RF signal. The RF signal consists of a baseband signal modulated on a carrier frequency signal. Because the baseband signal is a relatively low frequency signal, the baseband signal is modulated onto the higher frequency carrier signal before transmission. Conversely, because the carrier frequency is a relatively high frequency signal, the RF signal is down-converted to a lower frequency upon reception and before further processing.

Conventional heterodyne receivers down convert a radio-frequency (RF) signal to a baseband signal using one or more intermediate stages in which the RF signal is converted to one or more intermediate-frequency signals, lower than the RF signal, until the base-band frequency is reached. A heterodyne transmitter generates a higher frequency RF signal from a baseband signal using one or more intermediate stages to up-convert the frequency.

A homodyne or "direct conversion" receiver directly down-converts radio-frequency (RF) signals to baseband frequency without intermediate stages. Analogously a direct conversion transmitter up-converts from base-band to RF without intermediate stages. Direct conversion transceivers are particularly useful in multi-band transceivers, because of the elimination of the intermediate frequency passband filtering components and the resulting space savings. In addition, in direct conversion transceivers there is a corresponding reduction in the complexity of the transceivers.

Mixers are used in transceivers to convert a signal from a low frequency to a high frequency or a high frequency to a low frequency by mixing the signal with a local oscillator signal. The local oscillator frequency can be above or below the frequency of the desired signal to produce a sum and a difference frequency, one of which is the frequency of interest. There are many types of mixers including unbalanced, single and double balanced mixers. Mixers may be further categorized as passive or active.

Conventional mixers are implemented in various semiconductor technologies such as silicon and gallium arsenide with diodes, bipolar junction transistors (BJT), field effect transistors (FET), or other variations of these types. Increasingly, integrated circuits (ICs) having complementary metal-oxide semiconductor (CMOS) technology are being used in radio frequency (RF) circuits, including radio frequency (RF) circuits for wireless (LAN) networks.

CMOS technology is making lower cost, smaller ICs possible in wireless applications and facilitates single-chip implementation of baseband processing and RF transceiver circuits. RF CMOS transceiver ICs are increasingly being used in LAN networks using the 5 GHz waveband, under the IEEE802.11a standard. For example, Atheros Communications™ manufactures the AR5000 which is described as a complete 5 GHz "Radio-on-a-Chip" (RoC) and provides full wireless LAN connectivity based on the IEEE 802.11a 5 GHz standard. This standard provides 5 GHz wireless transfer speeds of 54 megabits per second (Mbps), thus allowing for high speed wireless transfer of large amounts of content.

Thus, increasingly, direct conversion transceivers implemented with CMOS technology are being used in such wireless communication applications. Mixers used in direct conversion transceivers generally require low flicker (1/f) noise. The 1/f noise is an intrinsic noise phenomenon found in semiconductor devices. Active mixer circuits implemented in CMOS generally suffer from 1/f problems. Passive mixer circuits implemented in CMOS, on the other hand, generally exhibit a low noise figure. Thus, it is advantageous to use passive mixer circuits in direct conversion transceivers implemented with CMOS technology due to the improved noise figure.

A conventional CMOS implemented passive mixer circuit used in a receiver is shown in FIG. 1. In FIG. 1, the RF input signal to be down converted is fed into input terminals 101 and 103 and through capacitors 112 and 114 to the source terminals of the NMOS field effect transistor (FET) differential pairs 102 (M1), 104 (M2) and 106 (M3), 108 (M4) of passive mixer circuit 100. The local oscillator signal (LO) to be mixed with the RF signal is connected to the gate terminals of FETs 102 and 108. The 180-degree phase shifted or "complementary" local oscillator signal (LOC) is connected to the gate terminals of FETs 104 and 106. A transformer or other phase shifting device (not shown) can provide this phase shift input. DC power and biasing are provided to the differential pairs 102, 104 and 106, 108 in a manner known in the art.

Because the differential pairs 102, 104 and 106, 108 are driven by local oscillator signals that are 180 degrees out of phase, only one of FET pair 102, 108 or FET pair 104, 106 is on at a given time. Passive mixer circuit 100 multiplies the incoming signal RF-in with the local oscillator signal, producing sum and difference frequencies.

High linearity performance is required in mixer circuits used in wireless communication applications. Passive mixer circuits such as the one shown in FIG. 1 generally have poor linearity performance. One parameter by which the linearity performance of a mixer may be defined is the input third-order intercept point (IIP3) of the mixer. The IIP3 is a measure of third-order non-linearity in the transfer function of a circuit. Due to the third-order non-linearity, output third-order intermodulation products (IM3) may be generated which may distort the desired output signal. The power of the desired signal at the output of a linear circuit increases linearly with the input power of the circuit. However, the power of the output IM3 increases with the cube of the input power. Stated in another way, every 1 dB increase in the input RF signal results in a 1 dB increase in the output RF signal, but a 3 dB increase in the third order products. The IIP3 is the RF signal input power level at which the power of the desired signal at the output of a circuit is equal to the power of the output IM3.

A representative plot 200 of a first order (fundamental) RF signal output 202 and third-order intermodulation products (IM3) 204 versus an RF signal input is shown in FIG. 2. Horizontal axis 206 represents the power of the RF input signal measured in dBm (decibels referenced to a power of 1 milliwatt). Vertical axis 208 represents the power of the first order RF signal output and third-order intermodulation products (IM3) in dBm. It can be seen from FIG. 2 that the IIP3 216 is an input power level where the desired RF output signal and the IM3become equal in amplitude. IIP3 216 is a theoretical value since saturation occurs before the IIP3 point is reached. IIP3 216 may be obtained by extrapolating from the RF signal output 202 and third-order intermodulation products (IM3) 204 plots (as shown by extrapolated lines 212 and 214) until the two extrapolated lines 212 and 214 meet, as shown by point 210.

Thus, it can be seen from plot 200 that the IM3 204 increases with increasing RF input signal power until the RF input signal power reaches IIP3 216 on the horizontal axis of representative plot 200. At IIP3 216, the IM3 would theoretically be equal to the desired RF signal output 202. It can also be seen from plot 200 that the linearity performance of a particular mixer may be improved by increasing the IIP3, i.e. by increasing the RF signal input power level at which IM3 is equal to the desired RF output signal.

One reason that increased RF input signal power causes increased distortion (such as IM3) can be seen in FIG. 3. FIG. 3 shows a plot 300 of a LO signal 302 and an RF-in signal 304 as applied to FET 102 (shown in FIG. 1). For the sake of simplicity, the operation of only one FET in mixer circuit 100 is described. However, the other three FETs operate in a similar manner. The horizontal axes of the LO signal 302 and the RF-in signal 304 plots, represent time t. The vertical axes of the LO signal and the RF-in signal plots represent signal voltage amplitude. Plot 300 also includes the gate to source voltage ($V_{gs}$) 306 (vertical axis) of FET 102 at time t (horizontal axis). When $V_{gs}$ 306 for FET 102 reaches a defined turn-on threshold voltage 308, FET 102 will turn on. Similarly, when $V_{gs}$ 306 for FET 102 reaches a defined turn-off threshold voltage 310, FET 102 will turn off. The $V_{gs}$ of FET 102 may be defined as LO–RF-in. Thus, at any time t, the $V_{gs}$ 306 of FET 102 will be equal to the amplitude of the LO signal 302 minus the amplitude of the RF-in signal 304.

In general, an LO signal is designed to be much larger than an RF-in signal. Thus, when an RF-in signal amplitude is low, a $V_{gs}$ of a FET will essentially be determined by the voltage amplitude of the LO signal and the $V_{gs}$ waveform of the FET will essentially track the LO signal waveform. However, for a larger amplitude RF-in signal such as RF-in signal 304 shown in FIG. 3, the amplitude of the $V_{gs}$ 306 of FET 102 becomes more dependent on the RF-in signal 304 amplitude at any time t. Thus, as the higher amplitude RF-in signal 304 varies in amplitude over time t, the $V_{gs}$ 306 of FET 102, and thus the on and off times of FET 102, become time-varying and non-symmetrical during the positive and negative half cycles of the RF-in signal 304.

This can be seen clearly from the plot of $V_{gs}$ 306 in FIG. 3. During the first positive half cycle of the RF-in signal 304 (t1), the LO signal 302 is positive and FET 102 is only turned on for the portion of t1 where LO–RF-in is equal to or greater than the defined turn-on threshold voltage 308. Thus, FET 102 is turned on for only a short portion of t1. Similarly, during the first negative half cycle of the RF-in signal 304 (t2), the LO signal 302 is positive and FET 102 is turned on for the portion of t1 where LO–RF-in is equal to or greater than the defined turn-on threshold voltage 308. Thus, FET 102 is turned on for a long portion of t2 due to the fact that the RF-in signal 304 has a large negative value during t2.

During the second positive half cycle of the RF-in signal 304 (t3), the LO signal 302 is negative and FET 102 is turned off for the portion of t3 where LO–RF-in is equal to or less than the defined turn-off threshold voltage 310. Thus, FET 102 is turned off for a long portion of t3. Similarly, during the second negative half cycle of the RF-in signal 304 (t4), the LO signal 302 is negative and FET 102 is only turned off for the portion of t4 where LO–RF-in is equal to or less than the defined turn-off threshold voltage 310. Thus, FET 102 is turned off for only a short portion of t4.

Because of this dependency of the $V_{gs}$ 306 of FET 102 on the time varying amplitude of the larger RF-in signal 304, the stage prior to passive mixer circuit 100 will encounter variations in loading. As a result, the output baseband signal at output terminals 105 and 107 will be nonlinear, as shown in FIG. 4.

Many efforts have been made to improve the linearity performance of mixer circuits used in communication systems. For example, a mixer circuit for improving linearity performance in a transceiver requiring an intermediate frequency is disclosed in U.S. Pat. No. 6,064,872 entitled "Totem Pole Mixer Having Grounded Serially Connected Stacked FET Pair". A high dynamic range mixer apparatus and mixing method are described where a wide high dynamic range is achieved in part due to the use of a series pair of switching devices that are matched so as to reduce nonlinearity distortion. An active mixer circuit for improving the intermodulation (IM) performance in a receiver requiring an intermediate frequency is disclosed in U.S. Pat. No. 6,140,849. An active double-balanced mixer with embedded linearization amplifiers includes a feedback circuit, along with a pair of operational amplifiers, for the purpose of improving the IM performance. Another active mixer circuit for use in a direct conversion receiver which provides reduced even order distortion is disclosed in U.S. Pat. No. 6,021,323 entitled "Direct Conversion Receiver With Reduced Even Order Distortion". The active mixer circuit includes a compensating differential amplifier which injects equal amplitude opposite phase currents with respect to even order distortion currents. Another mixer circuit which provides intermodulation and harmonic distortion suppression is disclosed in U.S. Pat. No. 6,144,236 entitled "Structure And Method For Super FET Mixer Having Logic-Gate Generated FET Square-Wave Switching Signal". A triple-balanced passive reflection FET mixer is disclosed having a substantially square wave switching waveform derived or regenerated from a sinusoidal local oscillator waveform.

However, there remains a need for an easily implemented passive mixer circuit for reducing or substantially eliminating nonlinear distortion for use in a direct conversion transceiver employed in high speed wireless communication applications which is satisfied by the inventive ultra-high linearity CMOS passive mixer circuit described hereinafter.

SUMMARY OF THE DISCLOSURE

Therefore, it is an advantage of embodiments of the present invention to overcome the problems in the existing art described above by providing a mixer circuit for use in a transceiver within a communication system node that reduces reducing or substantially eliminating nonlinear distortion.

According to embodiments of the invention, a passive mixer circuit is described, including dual pairs of NMOS FETs and dual pairs of PMOS FETs. Each NMOS FET is connected in parallel with a corresponding PMOS FET. A local oscillator signal is provided to the gate of one FET while a 180-degree phase shifted local oscillator signal is provided to the gate of its complementary FET. Because the complementary FETs are driven by local oscillator signals that are 180 degrees out of phase, the NMOS FET is turned on for at least a portion of the positive cycle of the local oscillator signal and the PMOS FET is turned on for at least a portion of the negative cycle of the 180-degree phase shifted local oscillator signal. Distortion in the mixed output signal is thereby reduced.

These and other features and advantages of embodiments of the invention will be apparent to those skilled in the art from the following detailed description of embodiments of the invention, when read with the drawings and appended claims.

BRIEF DESCRIPTION OF THE DRAWINGS

The present invention is illustrated by way of example, and not by way of limitation, in the figures of the accompanying drawings and in which.

DETAILED DESCRIPTION OF THE PREFERRED EMBODIMENTS

In the following description of preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the preferred embodiments of the present invention.

Embodiments of the present invention relate, generally, to communication systems and processes which have RF transceivers employing mixers for converting a signal from a low frequency to a high frequency or a high frequency to a low frequency by mixing the signal with another signal.

RF transceivers employing mixers according to embodiments of the present invention may be employed in a variety of communications electronics, including wireless transmission systems as well as wired systems. Thus, embodiments of the invention described herein may involve various forms of communications systems. However, for purposes of simplifying the present disclosure, preferred embodiments of the present invention are described herein, in relation to wireless applications, including, but not limited to wireless Local Area Networks (LANs), wireless personal communication devices including radios, cellular telephones, mobile cordless telephones, Personal Digital Assistants (PDAs), Personal Computer Memory Card International Association (PCMCIA) computer interface applications, telemetry systems, global positioning systems (GPS) and other radio frequency (RF) devices. In these applications, it is typically desirable to improve the linearity performance of the RF transceiver.

Communications system nodes such as, but not limited to, notebook computers, workstations, personal computers, PDAs or other electronic processing devices may be interconnected via a wireless LAN. Each Communications system node generally includes a communications controller and a wireless transceiver. The communications controller controls data exchange between the computer system and the wireless transceiver. Example functions of the communications controller include channel selection, organization of data packets for transmission and reception across the LAN, and error correction on received data packets.

Figure 5:
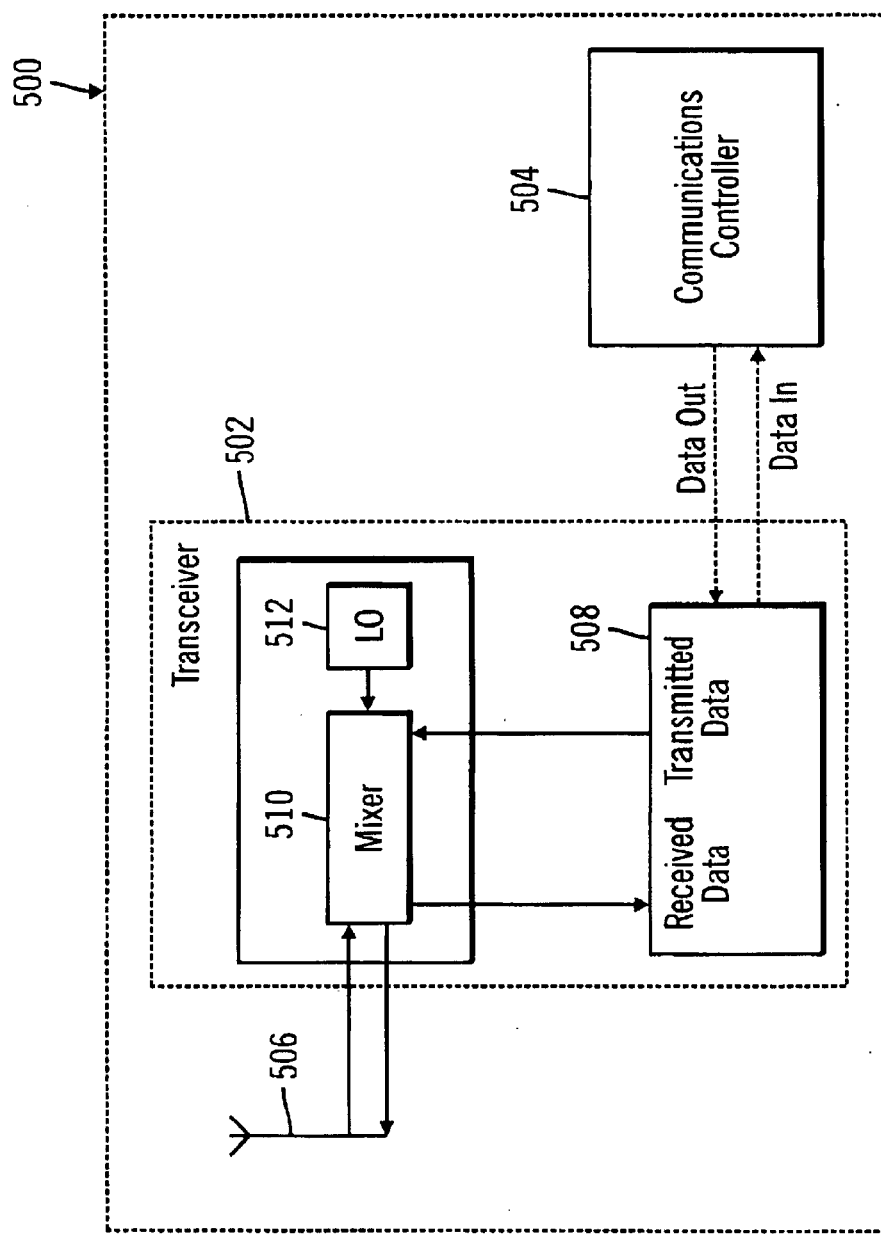
FIG. 5 illustrates a simplified block diagram of a communications system node comprising a mixer according to embodiments of the present invention.

FIG. 5 is a simplified block diagram of a communications system node 500 such as a notebook computer, cordless telephone, PDA or other radio frequency (RF) device in which embodiments of the present invention may be employed. Communications system node 500 is preferably part of a wireless LAN such as, but not limited to, an IEEE 802.11a standard radio LAN, wide area network (WAN), cellular network or other RF application such as, but not limited to, a cordless or wireless telephone system. Communications system node 500 preferably operates using a 5 GHz band. The IEEE 802.11a standard provides 5 GHz wireless transfer speeds up to 54 megabits per second (Mbps). This high speed makes possible a wireless multimedia environment, allowing for high speed wireless transfer of large amounts of content over a network.

Communications system node 500 includes, but is not limited to, a radio transceiver 502, a communications controller 504, and antenna 506. In one embodiment, the antenna may be incorporated directly into transceiver 502. Transceiver 502 includes transceiver circuits 508, a mixer 510 and a local oscillator 512. An RF input and output of mixer 510 are coupled to antenna 506. The LO input of mixer 510 is coupled to the LO 512. Received data and transmitted data are communicated between communications controller 504, transceiver circuits 508 and mixer 510.

In operation, the communications controller 504 controls the flow of data. The receiver portion of transceiver 502 performs RF demodulation signal processing for communications system node 500. In the receive mode, antenna 506 receives a modulated carrier wave or RF signal and provides it to mixer 510. The LO provides a mixing signal corresponding to a selected channel in the appropriate frequency range. Mixer 510 provides essentially the multiplicative product of the signals from its two inputs to transceiver circuits 508. Transceiver circuits 508 further process the product of the signals and provide a filtered baseband signal to communications controller 504.

Figure 6:
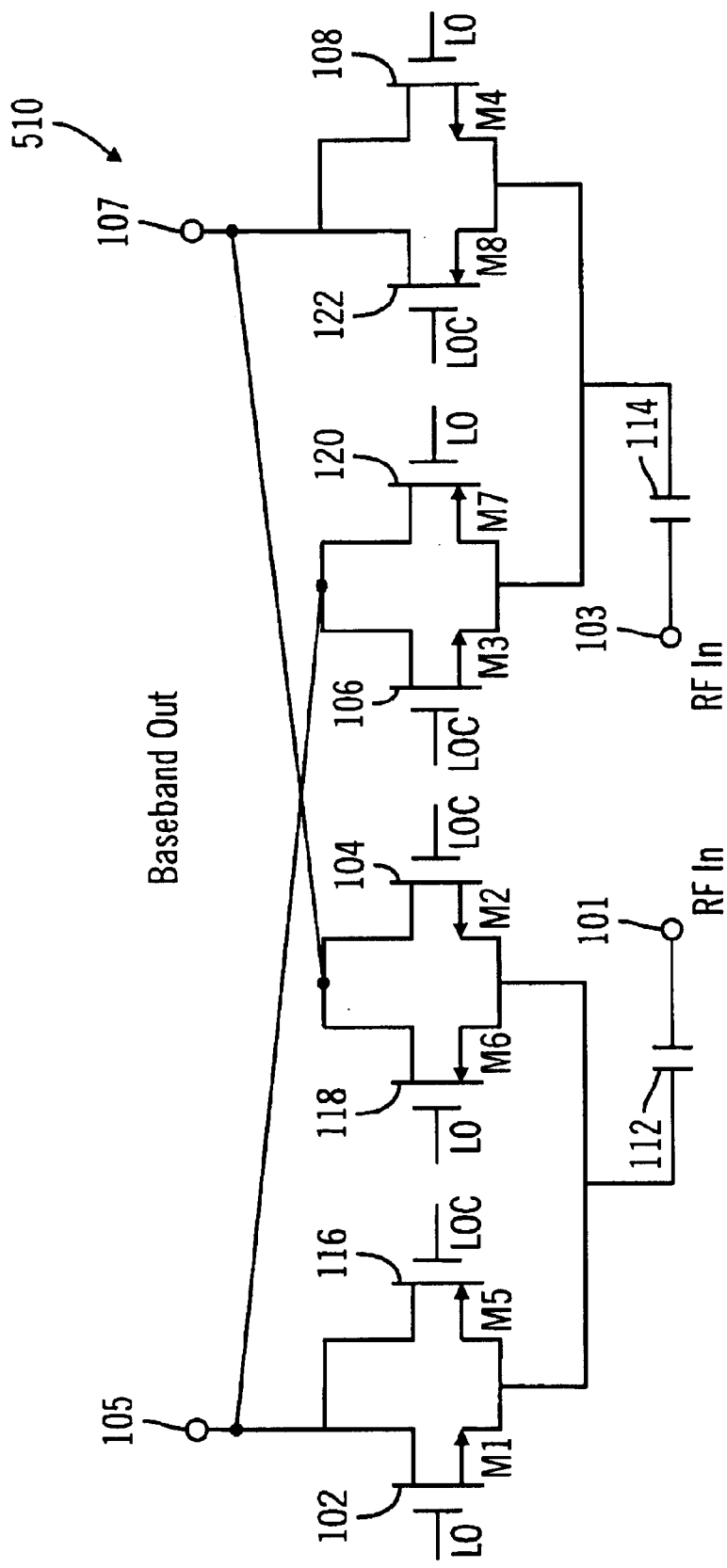
FIG. 6 illustrates a CMOS implemented passive mixer circuit according to embodiments of the present invention.

A circuit schematic of mixer 510 according to a preferred embodiment of the present invention is shown in FIG. 6. The CMOS implemented passive mixer circuit shown in FIG. 6 differs from the conventional passive mixer circuit 100 shown in FIG. 1 by incorporating a complementary PMOS FET in parallel with each corresponding NMOS FET of the conventional passive mixer circuit. As is well known in the art, the PMOS FET and NMOS FET are complementary because they will conduct on opposite alternations of the same periodic input signal. As shown in FIG. 6, there are two pairs of NMOS FETs and two pairs of PMOS FETs in mixer 510. One of each of the pairs of PMOS FETs corresponds to one of the pairs of NMOS FETs. That is, for each pair of NMOS FETs there is a corresponding pair of PMOS FETs that are connected in parallel with the NMOS FETs. As shown in FIG. 6, the drain and source terminal of PMOS FET 116 (M5) are connected to the drain and source terminals, respectively, of corresponding NMOS FET 102, while the drain and source terminals of PMOS FET 118 (M6) are connected to the drain and source terminals, respectively, of corresponding NMOS FET 104. In like manner, the drain and source terminals of PMOS FET 120 (M7) are connected to the drain and source terminals, respectively, of corresponding NMOS FET 106, while the drain and source terminals of PMOS FET 122 (M8) are connected to the drain and source terminals, respectively, of corresponding NMOS FET 108.

The RF input signal to be down converted is fed into input terminals 101 and 103 and through capacitors 112 and 114 to the source terminals of the complementary NMOS/PMOS FET pairs 102, 104, 116, 118 and 106, 108, 120, 122 of passive mixer circuit 510. Capacitors 112 and 114 block DC current. The local oscillator signal (LO) to be mixed with the RF signal is connected to the gate terminals of NMOS FETs 102, 108 and PMOS FETs 118, 120. The 180-degree phase shifted LOC signal is connected to the gate terminals of NMOS FETs 104, 106 and PMOS FETs 116, 122. A transformer or other phase shifting device (not shown) can provide this phase shift in a known manner. DC power and biasing are provided to the complementary NMOS/PMOS FET pairs 102, 104, 116, 118 and 106, 108, 120, 122 in a manner known in the art.

During operation of the mixer 510, the LO signal provided to the gates of the NMOS FETs 102, 108 and the PMOS FETs 118, 120 will turn on the NMOS FETs 102, 108 during a portion of its positive half cycle and will turn on the PMOS FETs 118, 120 during a portion of its negative half cycle. Similarly, the LOC signal provided to the gates of the NMOS FETs 104, 106 and PMOS FETs 116, 122 will turn on the PMOS FETs 116, 122 during a portion of its negative half cycle and will turn on the NMOS FETs 104, 106 during a portion of its positive half cycle. Thus, for a given complementary NMOS/PMOS FET pair, the positive half cycle of the LO signal is provided to the gate of the NMOS FET in the pair during the same time period that the negative half cycle of the LOC signal is provided to the gate of the PMOS FET in the pair. Therefore, for a given complementary NMOS/PMOS FET pair, both the NMOS FET and the PMOS FET will turn on during a portion of this time period.

Similarly, the negative half cycle of the LO signal is provided to the gate of the NMOS FET in the pair during the same time period that the positive half cycle of the LOC signal is provided to the gate of the PMOS FET in the pair. Therefore, both the NMOS FET and the PMOS FET will turn off during a portion of this time period. The portion of the time period that a FET is turned on or off is determined by the turn-on threshold voltage and turn-off threshold voltage for a given FET.

Thus, it may be seen that the polarity of $V_{gs}$ required to turn the PMOS FETs in mixer 510 on and off is the opposite of the polarity of $V_{gs}$ required to turn the NMOS FETs in mixer 510 on and off. In addition to this, the local oscillator signal (LO) applied to the gate of one FET in a complementary pair is 180-degree phase shifted with respect to the LOC signal applied to the gate of the other FET in the complementary pair at any time t.

Figure 7:
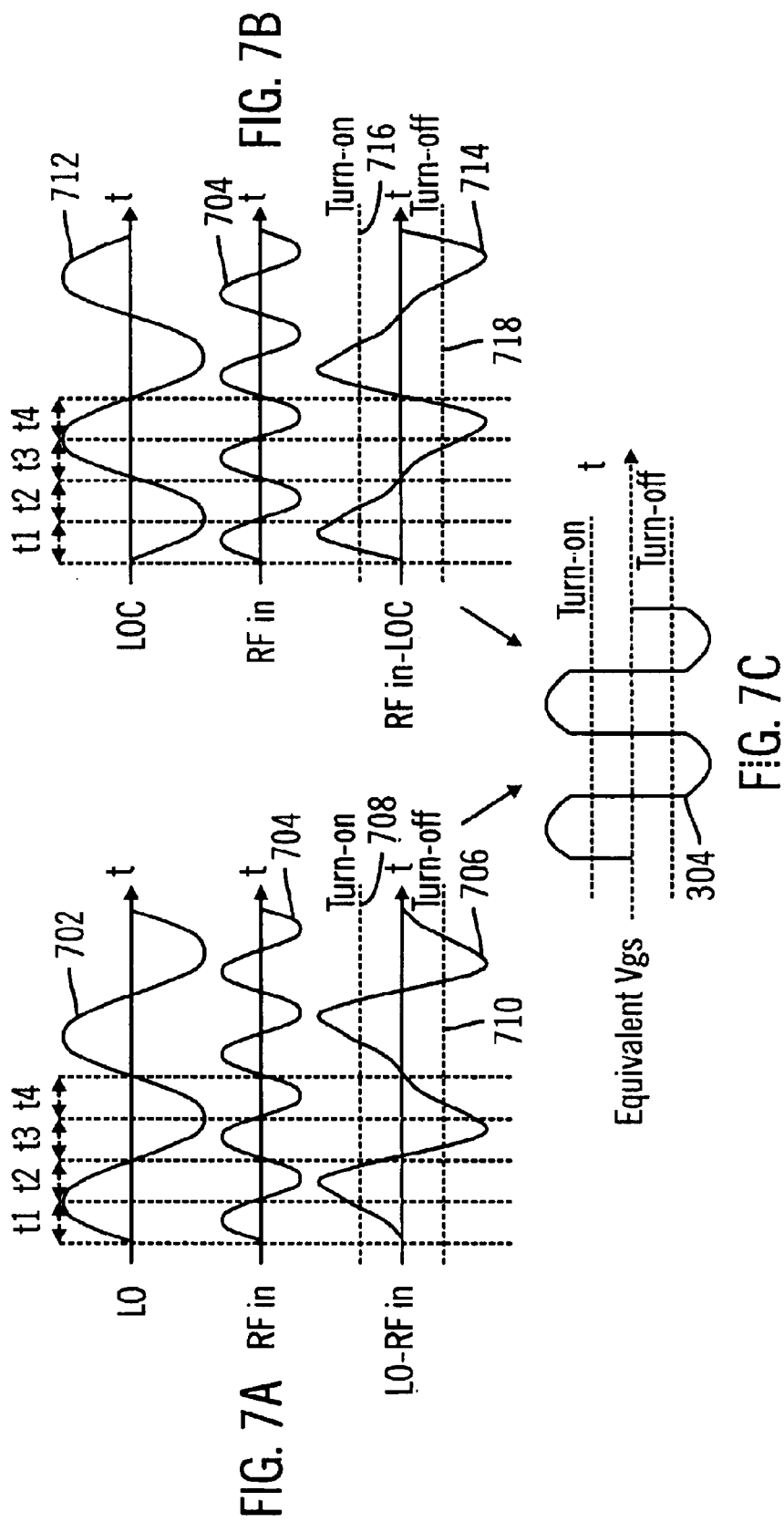
FIG. 7A illustrates a plot of an operating gate to source voltage of an NMOS FET in the passive mixer circuit of FIG. 6, according to embodiments of the present invention.
FIG. 7B illustrates a plot of an operating gate to source voltage of an PMOS FET in the passive mixer circuit of FIG. 6, according to embodiments of the present invention.
FIG. 7C illustrates an undistorted baseband signal at the output the passive mixer circuit of FIG. 6, according to embodiments of the present invention.

The operation of mixer 510 can be seen in FIGS. 7A, 7B and 7C. For the sake of simplicity, the operation of only one complementary FET pair (102, 116) in mixer circuit 510 shown in FIG. 6 is described. However, the other three FET pairs operate in a similar manner. FIG. 7A shows a plot of the LO signal 702 and the RF-in signal 704 as applied to NMOS FET 102 (shown in FIG. 6). The horizontal axes of the LO signal 702 and the RF-in 704 signal plots represent time t. The vertical axes of the LO signal 702 and the RF-in signal 704 plots represent signal voltage amplitude. The gate to source voltage ($V_{gs}$) 706 (vertical axis) of NMOS FET 102 at time t (horizontal axis) is also shown in FIG. 7A.

FIG. 7B shows a plot of the LOC signal 712 and the RF-in signal 704 as applied to PMOS FET 116 (shown in FIG. 6). The horizontal axes of the LOC signal 712 and the RF-in signal 704 plots represent time t. The vertical axes of the LOC signal 712 and the RF-in signal 704 plots represent signal voltage amplitude. The gate to source voltage ($V_{gs}$) 714 (vertical axis) of PMOS FET 116 at time t (horizontal axis) is also shown in FIG. 7B.

When $V_{gs}$ 706 for NMOS FET 102 reaches a defined turn-on threshold voltage 708, NMOS FET 102 will turn on. Similarly, when $V_{gs}$ 706 for NMOS FET 102 reaches a defined turn-off threshold voltage 710, NMOS FET 102 will turn off. The $V_{gs}$ 706 of NMOS FET 102 may be defined as LO–RF-in. Thus, at any time t, $V_{gs}$ 706 of NMOS FET 102 will be equal to the amplitude of the LO signal 702 minus the amplitude of the RF-in signal 704.

In a complementary manner, when $V_{gs}$ 714 for PMOS FET 116 reaches a defined turn-on threshold voltage 716, PMOS FET 116 will turn on. Similarly, when $V_{gs}$ 714 for PMOS FET 116 reaches a defined turn-off threshold voltage 718, PMOS FET 116 will turn off. The $V_{gs}$ 714 of PMOS FET 116 may be defined as RF-in-LOC. Thus, at any time t, $V_{gs}$ 714 of PMOS FET 116 will be equal to the amplitude of the RF-in signal 704 minus the amplitude of the LOC signal 712.

Figure 1:
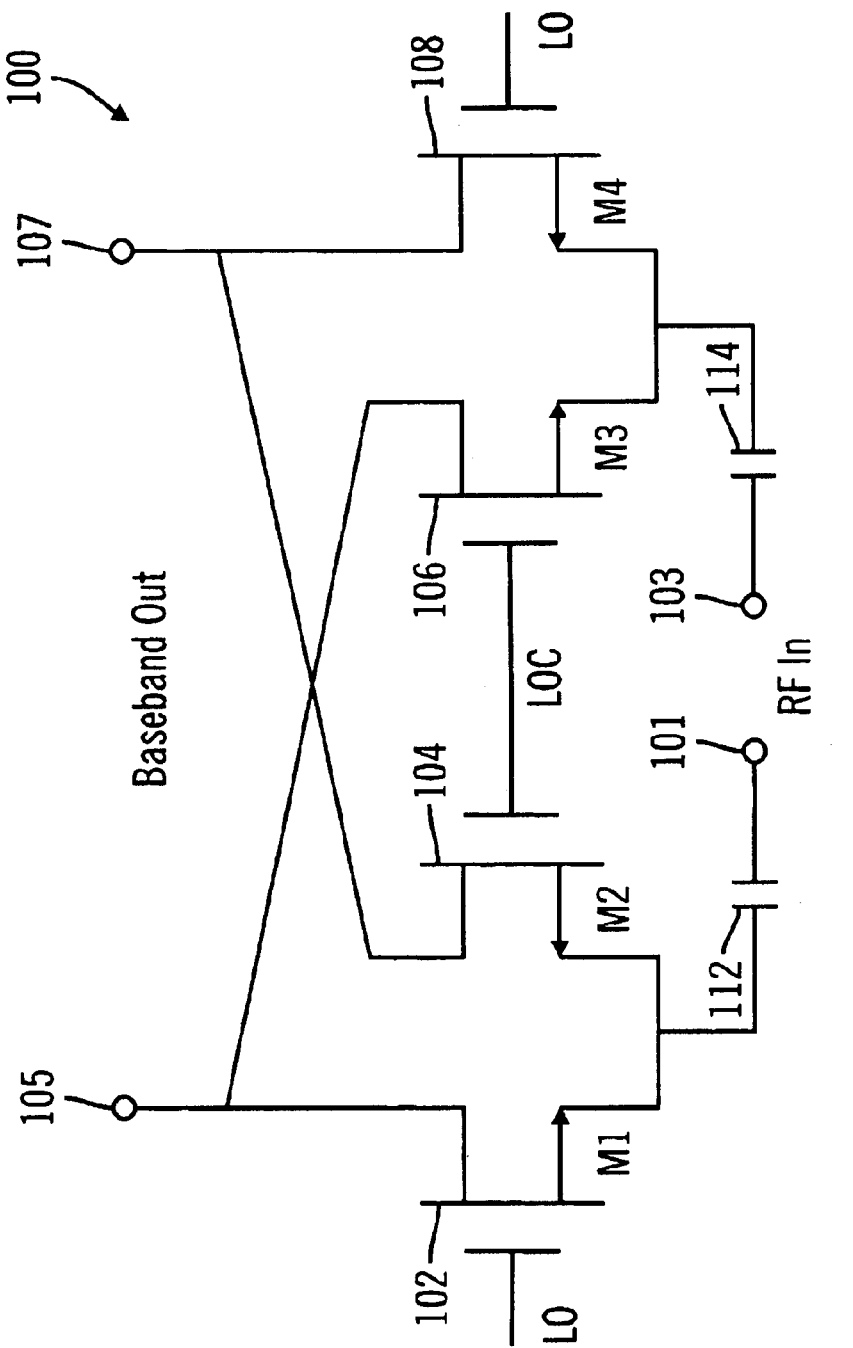
FIG. 1 illustrates a conventional CMOS implemented passive mixer circuit used in a receiver.
Figure 2:
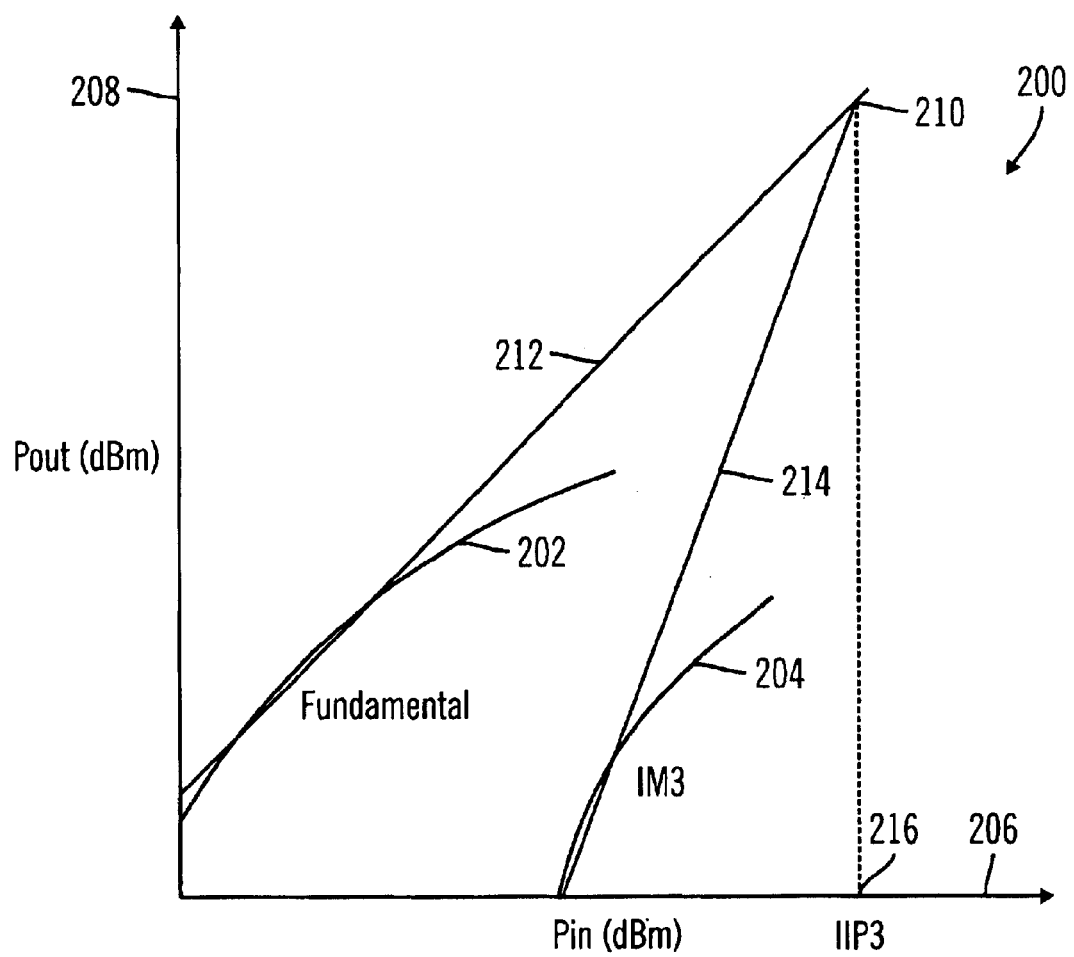
FIG. 2 illustrates a representative plot of a first order (fundamental) RF signal output and third-order intermodulation products (IM3) versus an RF signal input.
Figure 3:
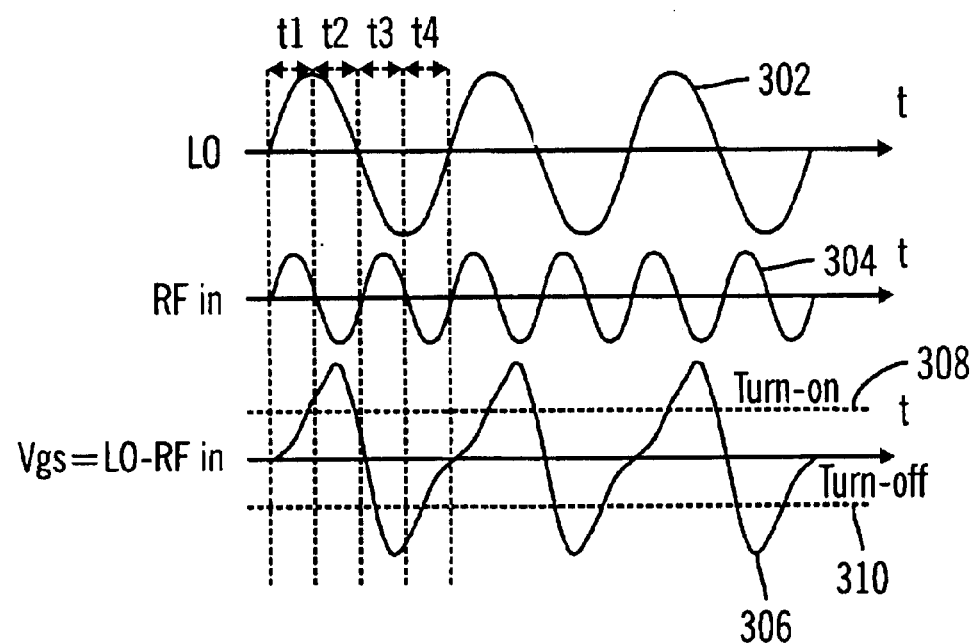
FIG. 3 illustrates a plot of an operating gate to source voltage of an NMOS FET in the passive mixer circuit of FIG. 1.
Figure 4:
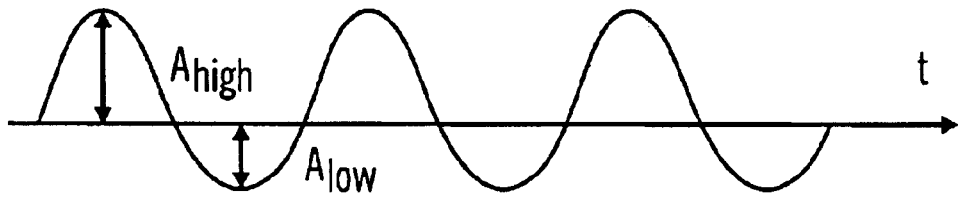
FIG. 4 illustrates a distorted baseband signal at the output the passive mixer circuit of FIG. 1.

As described above in relation to the operation of the conventional passive mixer circuit 100 shown in FIG. 1, for a larger amplitude RF-in signal such as RF-in signal 704 shown in FIGS. 7A and 7B, the amplitudes of $V_{gs}$ 706 and $V_{gs}$ 714 become more dependent on the RF-in signal 704 amplitude at time t. Thus, as the higher amplitude RF-in signal 704 varies in amplitude over time t, $V_{gs}$ 706 of NMOS FET 102 and $V_{gs}$ 714 of PMOS FET 116, and thus the on and off times of both FETs, become time-varying and non-symmetrical during the positive and negative half cycles of the RF-in signal 704. However, because embodiments of the present invention employ parallel complementary NMOS FET 102 and PMOS FET 116, the on and off times of both FETs are complementarily non-symmetrical at any time t during the positive and negative half cycles of the RF-in signal 704. In other words, during the period t1, NMOS FET 102 is off for most of period t1, while PMOS FET 116 is on for most of period t1. Similarly, during the period t2, NMOS FET 102 is on for most of period t2, while PMOS FET 116 is off for most of period t2. This complimentary operation of NMOS FET 102 and PMOS FET 116 substantially reduces distortion in the output of mixer 510.

The reduction in distortion can be seen clearly from the plot of the equivalent $V_{gs}$ waveform 720 shown in FIG. 7C. The waveform resulting from the combined $V_{gs}$ waveforms of NMOS FET 102 and PMOS FET 116 (the "equivalent $V_{gs}$ waveform") is much less distorted than the $V_{gs}$ waveforms for either NMOS FET 102 and PMOS FET 116 taken individually. This reduced distortion may reduce loading variations as seen by a stage prior to mixer 510 and thus may result in a improved linearity performance.

Computer simulations of the conventional passive mixer circuit 100 shown in FIG. 1 and the embodiment of the present invention shown in FIG. 6 were performed and the linearity performance of each determined by plotting the IIP3 for both circuits. Examples of simulation results are shown in FIGS. 8 and 9.

Figure 8:
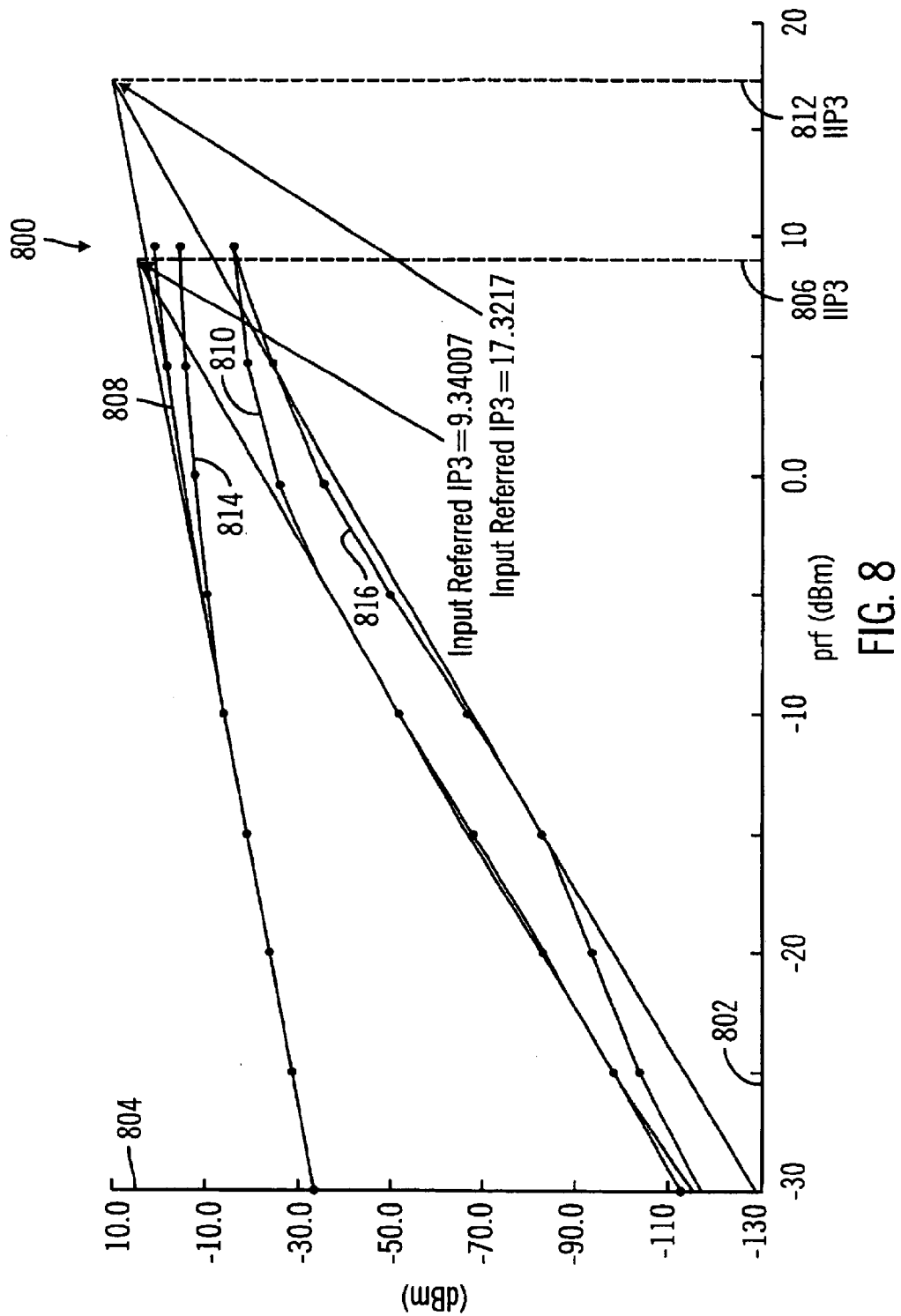
FIG. 8 illustrates a plot of first order (fundamental) RF signal outputs and third-order intermodulation products (IM3) versus RF signal inputs for both the conventional passive mixer circuit shown in FIG. 1 and the passive mixer shown in FIG. 6, according to embodiments of the present invention.

FIG. 8 shows a plot 800 of first order (fundamental) RF signal outputs and third-order intermodulation products (IM3) versus RF signal inputs for both the conventional passive mixer circuit 100 shown in FIG. 1 and passive mixer 510 as shown in FIG. 6. Horizontal axis 802 represents the power of the RF input signal measured in dBm. Vertical axis 804 represents the power of the first order RF signal output and third-order intermodulation products (IM3) in dBm. The IIP3 806 of the conventional passive mixer circuit 100 is determined by extrapolating the first order RF signal output 808 and the IM3 output 810 for passive mixer circuit 100, as shown in FIG. 8. Thus, it can be seen that the conventional passive mixer circuit 100 has an IIP3 806 of 9.54 dBm.

In the same manner, the IIP3 812 of passive mixer circuit 510 is determined by extrapolating the first order RF signal output 814 and the IM3 output 816 for passive mixer circuit 510, as shown in FIG. 8. Thus, it can be seen that passive mixer circuit 510 has an IIP3 812 of 17.32 dBm. Thus, it can be seen that the embodiment of the present invention shown in FIG. 6 exhibits an 8 dBm improvement in linearity over the conventional passive mixer circuit 100. Thus, passive mixer circuit 510 may accept an RF-in signal at least 8 dBm larger amplitude without distortion at its output. The larger amplitude RF-in signal improves the noise characteristics of the passive mixer 510, as smaller RF-in signals are more susceptible to noise.

Figure 9:
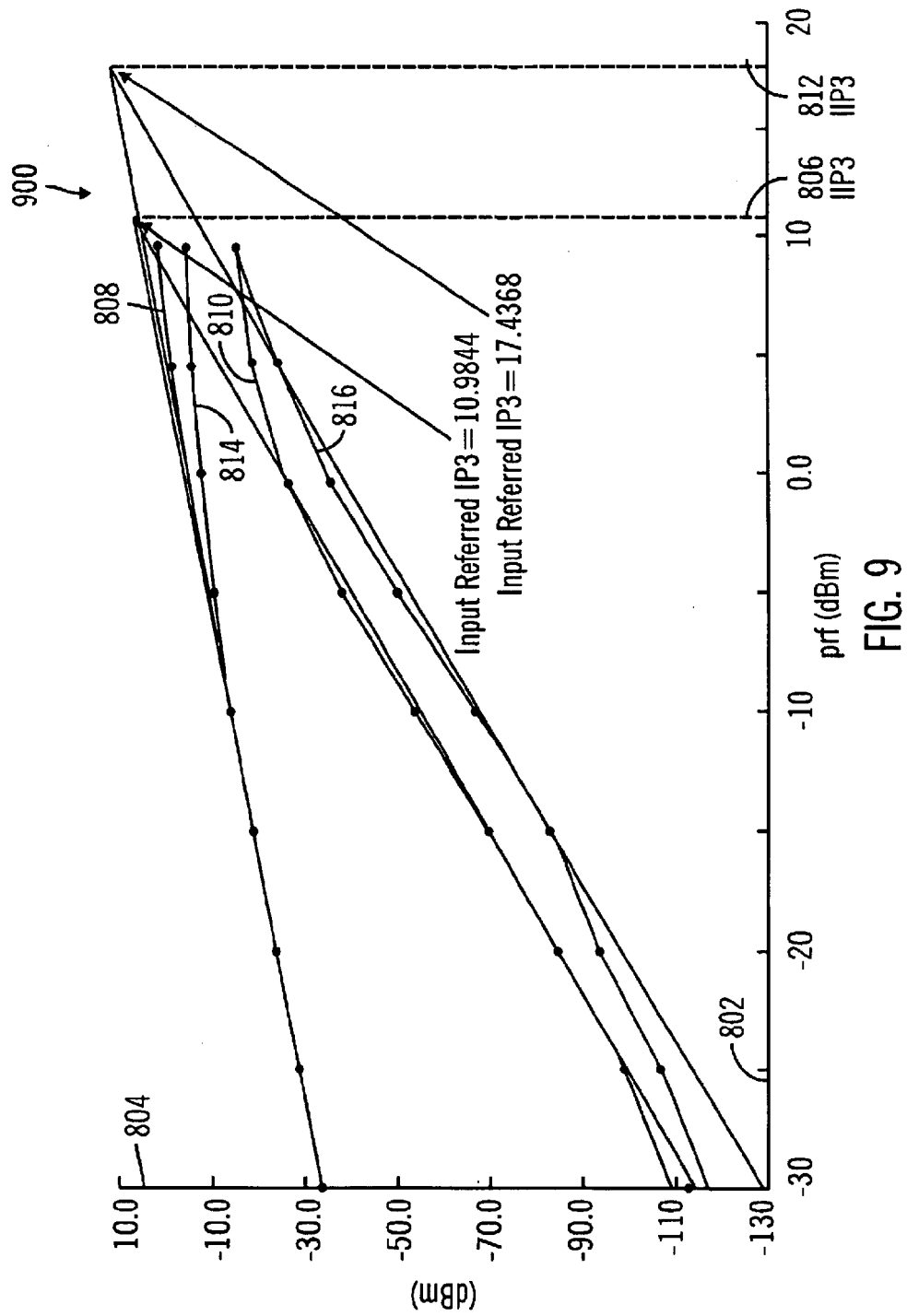
FIG. 9 illustrates a plot of first order (fundamental) RF signal outputs and third-order intermodulation products (IM3) versus RF signal inputs with a 5-degree phase shift for both the conventional passive mixer circuit shown in FIG. 1 and the passive mixer shown in FIG. 6, according to embodiments of the present invention.

FIG. 9 shows a plot 900 of first order (fundamental) RF signal outputs and third-order intermodulation products (IM3) versus RF signal inputs with a 5 degree phase shift. The IIP3 912 of conventional passive mixer circuit 100 has increased 1.44 dBm to 10.98 dBm due to the phase shift. In contrast, the IIP3 914 of passive mixer circuit 510 has only increased 0.12 dBm to 17.43 dBm. Thus, it can be seen from FIG. 9 that the linearity performance of passive mixer 510 is not substantially affected by a 5 degree phase shift.

Thus, some embodiments described above employ a CMOS implementation of a passive mixer circuit for improving linearity performance in wireless communication systems. Preferred embodiments of the present invention relate to a mixer circuit including dual pairs of NMOS FETs and dual pairs of PMOS FETs. Each NMOS FET is connected in parallel with a corresponding PMOS FET. A local oscillator signal is provided to the gate of one FET while a 180-degree phase shifted local oscillator signal is provided to the gate of its complementary FET. Because the complementary FETs are driven by local oscillator signals that are 180 degrees out of phase, the NMOS FET is turned on for at least a portion of the positive cycle of the local oscillator signal and the PMOS FET is turned on for at least a portion of the negative cycle of the 180-degree phase shifted local oscillator signal. Distortion in the mixed output signal is thereby reduced.

It is to be understood that even though numerous characteristics and advantages of various embodiments of the present invention have been set forth in the foregoing description, together with details of the structure and function of various embodiments of the invention, this disclosure is illustrative only. Changes may be made in detail, especially matters of structure and management of parts within the principles of the present invention to the full extent indicated by the broad general meaning of the terms in which the appended claims are expressed.

In addition, although the preferred embodiment described herein is directed to a mixer circuit for use in a communication system node in a wireless LAN, it will be appreciated by those skilled in the art that the teaching of the present invention may be applied to other RF wireless communication systems. In fact, any RF communication system is within the teachings of the present invention, without departing from the scope and spirit of the present invention. Furthermore, although the preferred embodiment described herein was directed to improving linearity performance in a passive mixer circuit employing NMOS FETs by the connection of PMOS FETs in parallel with the NMOS FETs, it will be appreciated by those skilled in the art that the teaching of the present invention may be applied to a passive mixer circuit employing PMOS FETs by the connection of NMOS FETs in parallel with the PMOS FETs.

Having disclosed exemplary embodiments and the best mode, modifications and variations may be made to the disclosed embodiments while remaining within the scope of the invention as defined by the following claims.

What is claimed is:

1. A mixer circuit comprising:
 a first switching device having a first terminal, a second terminal and a third terminal;
 a second switching device having a fourth terminal, a fifth terminal, and a sixth terminal, the fourth terminal corresponding with the first terminal, the fifth terminal corresponding with the second terminal and the sixth terminal corresponding with the third terminal;
 the first and second switching devices being connected in parallel with the second terminal being connected to the fifth terminal to form an output and the third terminal being connected to the sixth terminal to form an input;
 the first terminal being adapted to receive a first signal for mixing, the first signal having a positive cycle and a negative cycle;
 the fourth terminal being adapted to simultaneously receive a second signal for mixing, the second signal having a positive cycle and a negative cycle with substantially a 180 degree phase shift in relation to the first signal;
 the input being adapted to receive a third signal for mixing with the first and second signals to produce a fourth signal at the output;

wherein the first and second switching devices are complementary devices and wherein the first switching device is turned on by the first signal for at least a portion of the positive cycle of the first signal and the second switching device is turned on by the second signal for at least a portion of the negative cycle of the second signal such that distortion in the fourth signal is reduced.

2. The mixer circuit recited in claim 1, wherein the first signal is a local oscillator (LO) signal and the second signal is a complementary local oscillator (LOC) signal.

3. The mixer circuit recited in claim 1, wherein the third signal is an Radio Frequency (RF) signal.

4. The mixer circuit recited in claim 1, wherein the distortion is third-order intermodulation (IM3) distortion.

5. The mixer circuit recited in claim 1, further comprising a capacitor before the input for blocking DC current.

6. A mixer comprising:
a first field effect transistor (FET) and a second field effect transistor (FET), each having a gate, a drain and a source, the first and second FETs having their sources connected one to another to form an input and their drains connected one to another to form an output such that said first and second FETs are connected in parallel;
a local oscillator (LO) signal coupled to the gate of the first FET for turning on the first FET;
a complementary local oscillator (LOC) signal coupled to the gate of the second FET for turning on the second FET;
a radio frequency (RF) signal coupled to the sources of the first and second FETs for mixing with the local oscillator signal (LO) and the complementary local oscillator (LOC) signal to produce a mixed signal at the output;
wherein the first and second FETs are complementary FETs and wherein the first FET is turned on by the local oscillator (LO) signal for at least a portion of the positive cycle of the local oscillator (LO) signal and the second FET is turned on by the complementary local oscillator (LOC) signal for at least a portion of the negative cycle of the complementary local oscillator (LOC) signal such that distortion in the mixed signal is reduced.

7. The mixer recited in claim 6, wherein the first FET is an N-Channel Metal Oxide Semiconductor Field Effect Transistor (NMOS FET) and the second FET is a P-Channel Metal Oxide Semiconductor Field Effect Transistor (PMOS FET).

8. The mixer recited in claim 6, wherein the distortion is third-order intermodulation (IM3) distortion.

9. The mixer circuit recited in claim 6, further comprising a capacitor before the input for blocking DC current.

10. The mixer recited in claim 6, wherein the first and second FETs are fabricated on an integrated circuit.

11. The mixer recited in claim 6, wherein the first and second FETs are fabricated using Complementary Metal Oxide Semiconductor (CMOS) technology.

12. The mixer recited in claim 10, wherein the integrated circuit is employed in a LAN network having a 5 GHz waveband.

13. A mixer circuit comprising:
two pairs of N-Channel Metal Oxide Semiconductor Field Effect Transistors (NMOS FETs), each pair of NMOS FETs having source terminals connected one to another to form first and second input terminals to the mixer circuit, each NMOS FET in a respective one of the pairs having a drain terminal connected to a drain terminal of a corresponding NMOS FET in a respective other of the pairs to form first and second output terminals, one of the NMOS FETs in each of the respective pairs of the NMOS FETs having a gate driven by a first signal, the other of the NMOS FETs in each of the respective pairs of the NMOS FETs having a gate driven by a second signal;
two pairs of P-Channel Metal Oxide Semiconductor Field Effect Transistors (PMOS FETs), each respective pair of PMOS FETs having source terminals connected to the corresponding source terminals of a corresponding pair of the two pairs of NMOS FETs, and having drain terminals connected to the corresponding drain terminals of the corresponding pair of the two pairs of NMOS FETs such that one of each NMOS FET is connected in parallel to one of each PMOS FET, one of the PMOS FETs in each of the respective pairs of PMOS FETs having a gate driven by the first signal, the other of the PMOS FETs in each of the respective pairs of PMOS FETs having a gate driven by the second signal;
wherein the first and second input terminals are adapted to receive a third signal for mixing with the first and second signals to produce a fourth signal at the first and second output terminals and wherein distortion in the fourth signal is reduced.

14. The mixer circuit recited in claim 13, wherein the first signal is a local oscillator (LO) signal and the second signal is a complementary local oscillator (LOC) signal.

15. The mixer circuit recited in claim 13, wherein the third signal is an Radio Frequency (RF) signal.

16. The mixer circuit recited in claim 13, wherein the fourth signal is a baseband signal.

17. The passive mixer circuit recited in claim 13, wherein the distortion is third-order intermodulation (IM3) distortion.

18. The passive mixer circuit recited in claim 13, wherein the Radio Frequency (RF) signal is a 5 Gigahertz (GHz) wireless signal.

19. The mixer circuit recited in claim 13, further comprising a first capacitor before the first input and a second capacitor before the second input for blocking DC current.

20. A communications system for use in a wireless network, comprising:
an antenna;
a communications controller for controlling data flow;
a transceiver including a mixer circuit comprising:
a first field effect transistor (FET) and a second field effect transistor (FET), each having a gate, a drain and a source, the first and second FETs having their sources connected one to another to form an input and their drains connected one to another to form an output such that said first and second FETs are connected in parallel;
a local oscillator (LO) signal coupled to the gate of the first FET for turning on the first FET;
a complementary local oscillator (LOC) signal coupled to the gate of the second FET for turning on the second FET;
a radio frequency (RF) signal coupled to the sources of the first and second FETs for mixing with the local oscillator signal (LO) and the complementary local oscillator (LOC) signal to produce a mixed signal at the output;

wherein the first and second FETs are complementary FETs and wherein the first FET is turned on by the local oscillator (LO) signal for at least a portion of the positive cycle of the local oscillator (LO) signal and the second FET is turned on by the complementary local oscillator (LOC) signal for at least a portion of the negative cycle of the complementary local oscillator (LOC) signal such that distortion in the mixed signal is reduced.

21. The communication system node recited in claim 20, wherein the first FET is an N-Channel Metal Oxide Semiconductor Field Effect Transistor (NMOS FET) and the second FET is a P-Channel Metal Oxide Semiconductor Field Effect Transistor (PMOS FET).

22. The communication system node recited in claim 20, wherein the distortion is third-order intermodulation (IM3) distortion.

23. The communication system node recited in claim 20, wherein the wireless network comprises a LAN network employing a 5 GHz waveband.

24. In a mixer circuit for use in a transceiver, a method for reducing intermodulation distortion, comprising:

providing a first field effect transistor (FET) and a second field effect transistor (FET), each having a gate, a drain and a source, the first and second FETs having their sources connected one to another to form an input and their drains connected one to another to form an output such that said first and second FETs are connected in parallel;

providing a local oscillator (LO) signal coupled to the gate of the first FET for turning on the first FET;

providing a complementary local oscillator (LOC) signal coupled to the gate of the second FET for turning on the second FET;

providing a radio frequency (RF) signal coupled to the sources of the first and second FETs for mixing with the local oscillator signal (LO) and the complementary local oscillator (LOC) signal to produce a mixed signal at the output;

wherein the first and second FETs are complementary FETs and wherein the first FET is turned on by the local oscillator (LO) signal for at least a portion of the positive cycle of the local oscillator (LO) signal and the second FET is turned on by the complementary local oscillator (LOC) signal for at least a portion of the negative cycle of the complementary local oscillator (LOC) signal such that distortion in the mixed signal is reduced.

25. The method recited in claim 24, wherein providing a first field effect transistor (FET) and a second field effect transistor (FET) comprises providing an N-Channel Metal Oxide Semiconductor Field Effect Transistor (NMOS FET) and a P-Channel Metal Oxide Semiconductor Field Effect Transistor (PMOS FET).

26. The method recited in claim 24, wherein the distortion is third-order intermodulation (IM3) distortion.

27. The method recited in claim 24, wherein providing a first field effect transistor (FET) and a second field effect transistor (FET) comprises providing an integrated circuit having the first field effect transistor (FET) and the second field effect transistor (FET) fabricated thereon.

28. The method recited in claim 27, wherein providing an integrated circuit having the first field effect transistor (FET) and the second field effect transistor (FET) fabricated thereon comprises providing an integrated circuit having the first field effect transistor (FET) and the second field effect transistor (FET) fabricated thereon employing Complementary Metal Oxide Semiconductor (CMOS) technology.

* * * * *